United States Patent [19]

Nakamura et al.

[11] Patent Number: 4,517,550
[45] Date of Patent: May 14, 1985

[54] ANALOG TO DIGITAL CONVERSION METHOD AND APPARATUS

[75] Inventors: Kenji Nakamura, Osaka; Shigeru Ideno, Kyoto, both of Japan

[73] Assignee: Shimadu Corporation, Kyoto, Japan

[21] Appl. No.: 359,956

[22] Filed: Mar. 19, 1982

[30] Foreign Application Priority Data

Oct. 27, 1981 [JP] Japan .................................. 56-172643

[51] Int. Cl.³ ............................................. H03K 13/02
[52] U.S. Cl. ........................ 340/347 CC; 340/347 AD; 364/571; 324/115; 324/130
[58] Field of Search ................ 340/347 CC, 347 AD; 324/115, 130, 99 D; 364/571

[56] References Cited

U.S. PATENT DOCUMENTS

| | | | |
|---|---|---|---|
| 3,783,380 | 1/1974 | Bradley | 324/130 |
| 4,364,027 | 12/1982 | Murooka | 340/347 CC |
| 4,366,469 | 12/1982 | Michaels | 340/347 AD |

*Primary Examiner*—C. D. Miller
*Attorney, Agent, or Firm*—Griffin, Branigan & Butler

[57] ABSTRACT

An analog to digital conversion method and apparatus includes the use of a scaling circuit 15 to scale the magnitude of an analog signal D applied to ADC 4 to within an acceptable input range. A calibration circuit 16 generates a signal M indicative of the effect of the scaling circuit 15 upon a digital signal E produced by the ADC 4. An adder 14 adds the calibration signal M and the digital signal E of ADC 4 to yield a digital output signal N which is the digital representation of measured analog input signal A.

6 Claims, 3 Drawing Figures

ANALOG TO DIGITAL CONVERSION METHOD AND APPARATUS

BACKGROUND

This invention pertains to analog to digital converters and to methods for converting analog signals to digital signals.

Throughout recent years numerous types of analog to digital converters (ADCs) have been designed and marketed. In some applications an ADC may be selectively fed numerous analog input signals which belong to a broad range of analog values, and yet the ADC may also be expected to provide meaningful digital output signals to distinguish two analog input signals whose differences might be relatively slight. ADCs having high resolution capability have been generally employed for such applications. Yet the high resolution afforded by these ADCs generally increases proportionately the length of time required to perform the conversions. Only a very fast ADC could maintain fine resolution and keep down conversion time, but such fast ADCs have heretofore been difficult to fabricate, especially since all the elements of ADCs of this type must be operating at high and yet compatible speeds.

Hence, an object of this invention is the provision of a high speed, high resolution ADC which provides accuracy, but not at the expense of conversion time.

SUMMARY

An analog to digital conversion method and apparatus includes the use of a scaling circuit to scale an analog signal to within an acceptable range for an analog to digital converter (ADC). The scaling circuit utilizes a pair of comparators to determine if the analog signal is within the acceptable range and, when it is not, generate signals which selectively increment and decrement an up/down counter. The digital value contained in the up/down counter is applied to a digital to analog converter (DAC), which applies an analog signal to an input terminal of a subtraction unit. The subtraction unit also receives the measured input analog signal and generates a resultant signal indicative of the difference between the measured analog signal and the analog signal generated by the DAC. The resultant signal is applied to and accepted by the ADC when its magnitude is in the acceptable range.

A calibration circuit generates a signal indicative of the effect of the scaling circuit upon a digital signal produced by the ADC. The calibration circuit stores in a first register a first digital value corresponding to the digital signal produced by the ADC prior to a change of one digital bit in the up/down counter of the scaling circuit, and subsequently stores in a second register a second digital value corresponding to the digital value produced by the ADC after a change of one digital bit in the up/down counter. A subtraction unit takes the difference between the first and second digital values, and stores the subtraction result in a memory for repeated reference. The calibration circuit adds to the output of the ADC a digital calibration factor (which is the current content of the up/down counter multiplied by the stored subtraction result) to rapidly and accurately yield a converted digital value.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

Figure 1:
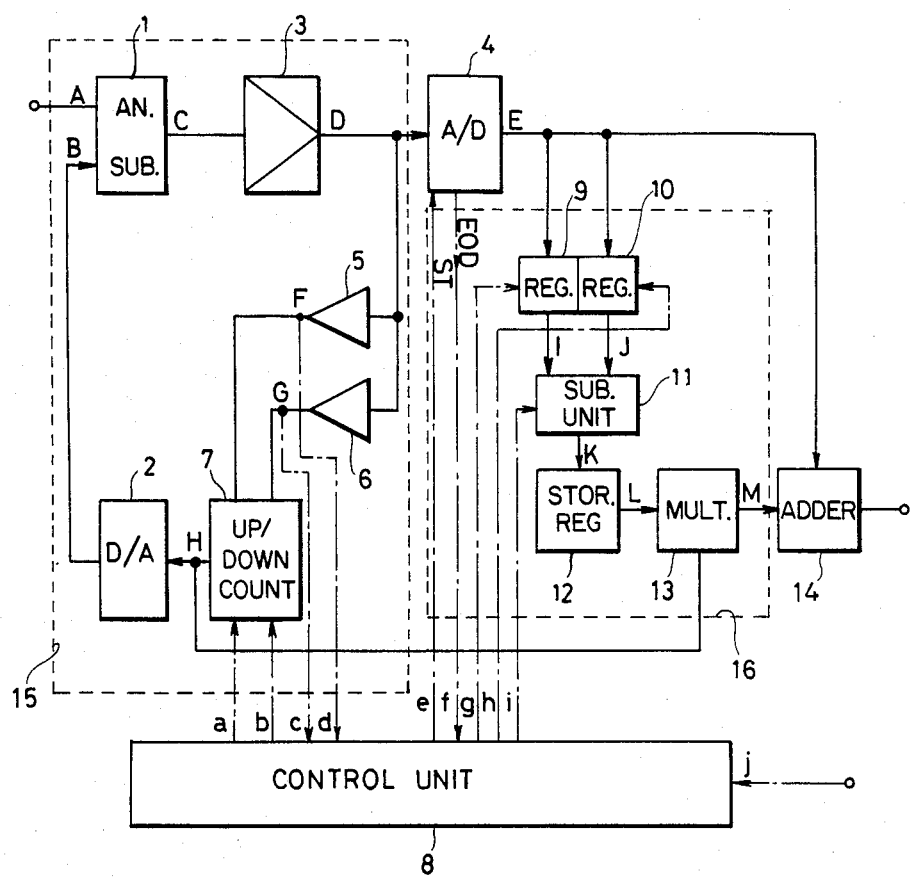
FIG. 1 is a schematic circuit diagram showing an embodiment of the invention.

The analog to digital apparatus of FIG. 1 comprises a scaling circuit 15; an analog to digital converter (ADC) 4; control unit 8; calibration circuit 16; and, adder 14. The scaling circuit 15 comprises an analog subtraction unit 1; amplifier 3; comparators 5 and 6; up/down counter 7; and, digital to analog converter (DAC) 2. The calibration circuit 16 comprises registers 9 and 10; subtraction unit 11; storage register 12; and, multiplier 13.

The analog subtraction unit 1 has two input terminals, one to receive a measured input signal A and the other to receive an output signal B of a DAC 2. The subtraction unit 1 substracts the value of signal A from signal B and applies a resultant analog signal to the amplifier 3 to which it is connected. The output terminal of amplifier 3 is connected to the input terminal of ADC 4 (having a 12 bit construction) and to the input terminals of comparators 5 and 6.

Comparators 5 and 6 are configured to monitor the analog input to the ADC 4. In this respect, when an output D of amplifier 3 is within the input range of the DAC 4, outputs F and G of comparators 5 and 6, respectively, both become low level values. If output signal D of amplifier 3 is under-scaled with respect to the full scale of ADC 4, output F of comparator 5 becomes a high level value. If signal D is over-scaled with respect to the full scale of ADC 4, output G of comparator 6 becomes a high level value.

The output terminals of comparators 5 and 6 are connected to input terminals of the up/down counter 7. The up/down counter 7 is so configured and connected to the control unit 8 by clock leads "a" and "b" so that the contents of counter 7 is incremented for each clock pulse "a" whenever output F is a high level value and decremented at each clock pulse "b" whenever output G is a high level value.

The output terminals of comparators 5 and 6 are also connected to the control unit 8 by leads "d" and "c", respectively. Control unit 8 utilizes high signals on leads "c" and "d" to determine whether the clock pulse internally generated in unit 8 should be applied to the lead for clocking signal "a" or to the lead for clocking signal "b".

The output terminal of up/down counter 7 is connected to the input terminal of DAC 2. DAC 2 is a 10 bit converter. DAC 2 produces an analog signal B in response to the counted digital value of the contents of up/down counter 7. As mentioned above, signal B is applied to subtraction unit 1. Whenever the the analog signal D of amplifier 3 is within the acceptable range for ADC 4, signal D enters the ADC 4.

The output terminal of ADC 4 is connected to data input terminals for registers 9 and 10, and also to a first input terminal of adder 14. Registers 9 and 10 are used to calibrate the DAC 2. In this respect, register 9 stores the digital output of ADC 4 before the contents of counter 7 (and hence the signal B from DAC 2) is changed by one bit (its least significant bit). Register 10 stores the digital output of ADC 4 after the contents of counter 7 is changed by one bit.

The output terminals of registers 9 and 10 are connected to input terminals of a subtraction unit 11 to apply respective signals I and J to unit 11. Subtraction unit 11 performs the subtraction operation J minus I (that is, J-I) and applies a resultant output signal K to the input terminal of the storage register 12 to which it is connected. Thus, register 12 contains therein a digital value indicative of the change in the output digital signal of ADC 4 occasioned by a change of the least significant bit of the digital signal H applied to the DAC 2.

The output terminal of register 12 is connected to a first input terminal of the multiplier 13. Signal H from the output terminal of up/down counter 7 is connected to a second input terminal of multiplier 13. Multiplier 13 multiplies signal L by signal H, thereby obtaining the resulting value M which is applied to a second terminal of adder 14.

Control unit 8 is connected to the ADC 4, registers 9 and 10, and subtraction unit 11 in the manner to be described. Control unit 8 is connected to ADC 4 by lead ST to apply a conversion start signal "e" thereto, and by lead EOC to receive from ADC 4 an end-of-conversion signal "f". Strobe lines connect unit 8 to register 9, register 10, and subtraction unit 11 to apply thereto strobe pulses "g", "h", and "i", respectively. Control unit 8 is connected to receive a signal "j" which determines whether the apparatus is in a calibration mode or a mode to convert a measured analog input signal.

Figure 2:
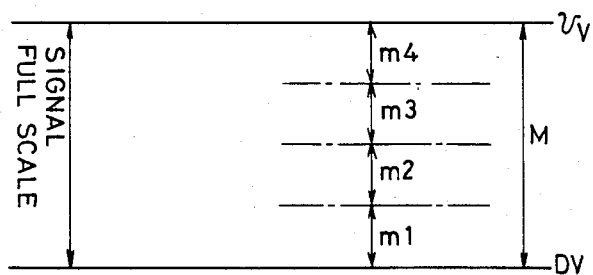
FIG. 2 is a graph depicting the acceptable input range of the ADC of FIG. 1; and, FIG. 3 is a diagram to illustrate the shifting of an error bit in accordance with an embodiment of the invention.

In operation, the scaling circuit 15 is calibrated prior to converting a measured input signal A. The result of calibration is that the storage register 12 contains therein a digital signal indicative of the change in the digital signal E of the ADC 4 when the contents of up/down counter 7 (and hence signal H and the amplitude of signal B generated by DAC 2) is changed by one bit (the least significant bit). For the calibration process, input signal A to subtraction unit 1 is set to be a constant value, such as 0 volts, for example. Up/down counter 7 is then operated using signal "a" (an "up" pulse) and signal "b" (a "down" pulse) to change the output of DAC 2 such that the analog signal D to ADC 4 is within an interval m2 as shown in FIG. 2. In this state, both outputs "c" (equivalent to G) and "d" (equivalent to F) of comparators 5 and 6 are low level signals. That the analog of signal D is within the interval m2 is confirmed by sending the conversion start signal "e" to ADC 4; waiting end-of-conversion signal "f"; and, then reading signal E by means of adder 4. At this point, the content of register 12 is zero.

Once the analog signal D is in the interval m2 as described above, pulse "g" is outputted to enable digital signal G to be gated into register 9. After the digital signal E is stored in register 9, control unit 8 sends a pulse as signal "b" to an input terminal of up/down counter 7 to decrement the digital contents of counter 7 by its least significant bit (LSB). Accordingly, the digital signal H is also decreased by the digital value "1". As a result, the analog output signal of DAC 2 is changed such that the analog signal D to ADC 4 lies within an interval m3 as shown in FIG. 2.

With the analog signal D to ADC 4 now in the interval m3, control unit 8 outputs to pulse "h" to enable the digital signal E to be gated into register 10. Next, control unit 8 outputs a pulse "i" to enable subtraction unit 11 to take the difference between signals I and J applied thereto. The value J-I is then applied to storage register 12 where it is stored for repeated reference throughout the measuring process described below. This digital value stored in register 12 is indicative of the change in the digital output of ADC 4 when the contents of up/down counter 7 is changed by one bit (the LSB).

FIG. 2 depicts the full scale range M (ranging from 0 to V volts) of the ADC 4. ADC 4 is a 12 bit converter, while DAC 2 is a 10 bit converter. A change in the LSB of DAC 2 effects the analog signal D by a factor of one-fourth of the full scale range M of ADC 4. For example, if analog signal D from amplifier 3 were somewhat overscaled (that is, being overscaled by an amount less than M/4 as seen in FIG. 2), the output signal D can be scaled into interval m4 if up/down counter 7 is incremented by one digital count.

Once the scaling circuit 15 has been calibrated in the above-described manner, the analog to digital conversion apparatus of the invention is ready to receive a measured analog signal as signal A to subtraction unit 1. Input signal A is subtracted in unit 1 from the analog signal B. The resulting output value C of unit 1 is amplified by amplifier 3 and then sent to ADC 4. If signal D is within the full scale range of ADC 4, the outputs F and G of comparators 5 and 6 are a low level value, and the counter content of up/down counter 7 remains unchanged. As a result, digital signal H (equal to the contents of up/down counter 7) is sent to multiplier 13 where it is multiplied by the signal L stored in register 12. Analog input signal D to ADC 4 is converted, and its output signal E is sent to adder 14. Adder 14 adds the digital signal E and the digital product L×H to obtain a resultant digital signal $N=L \times H+E$.

In the event that the signal D applied to ADC 4 from amplifier 3 is outside of the full scale of ADC 4 (that is, in a case of underscaling or overscaling) either comparator 5 or comparator 6, whichever is approximate as discussed above, operates to produce a high level signal as its output signal F or G, respectively. Up/down counter 7 is accordingly incremented or decremented in accordance with signals F or G when clocking signals "a" or "b", respectively, are pulsed by control unit 8. As the contents of up/down counter 7 is changed, the signals H, B, C, and D are also changed as ultimate results of the clocking signal "a" or "b". Control unit 8 pulses a series of internally-timed clocking signals "a" or "b" and causes the contents of up/down counter 7 to continue changing through a series of adjustment steps until signal D is in the acceptable full scale range of ADC 4. Once the signal D is within the full scale of ADC 4, outputs F and G of comparators 5 and 6, respectively, both become a low level value, and the incrementation or decrementation of up/down counter 7 is terminated. The value of H after incrementation or decrementation represents the relative number of adjustment steps (that is, the number of steps relative to the value of H at calibration) that the scaling circuit 15 is required to perform so that the analog signal D will lie within the acceptable input range to ADC 4. Output H of up/down counter 7 at that time is fed to multiplier 13, which multiplies the calibration digital signal L by signal H to produce a product (L×H). Adder 14 adds the digital output E of ADC 4 to the multiplication product (L×H), thereby obtaining an analog-to-digital converted value N of the measured signal A.

Figure 3:
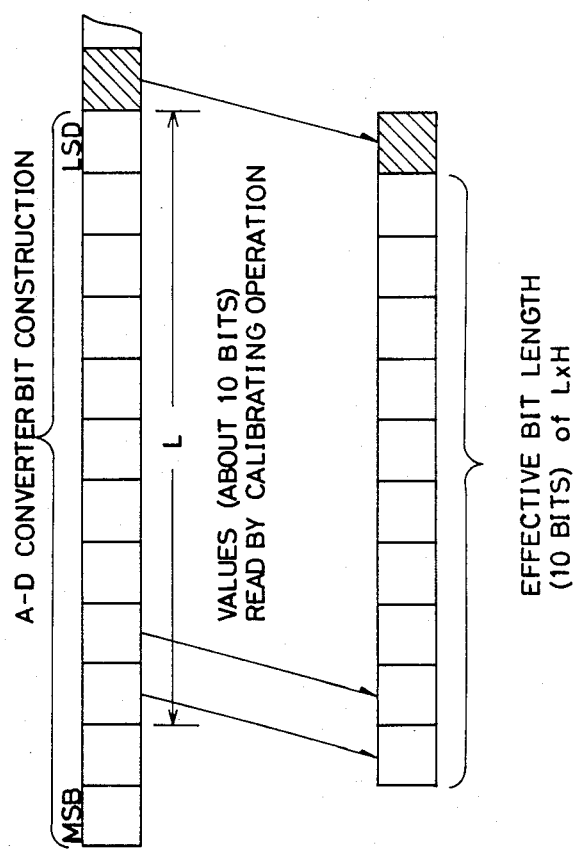

Inasmuch as the ADC 4 is of a 12 bit configuration, and inasmuch as the up/down counter 7 is of an 8 bit configuration, the apparatus is capable of handling a range of $2^{20}$ input values. Digital signal E from ADC 4 is a 12 bit value, whereas the value of signal L stored in register 12 during the calibration operation is small enough to be represented in 10 bits. Should any error occur in the calibration operation, the error would be in a bit of lower order than the LSB (also referred to as the LSD). This error bit is depicted in crosshatch representation in FIG. 3. In a case where signal H from the up/down counter 7 has a digital value "2", the multiplication of L×H in multiplier 13 is in effect a single bit left shift. As a result, the error bit is shifted left one bit as well. But only the ten upper order bits of the product are applied to the adder 14.

Thus, according to the present invention, a calibration factor of the scaling circuit 15 is stored in register 12 prior to actual conversion of the measured analog signal A. The conversion occurs rapidly since the upper bits of the calibration factor have already been determined and since the conversion speed depends primarily on the speed of ADC 4. Further, accuracy is provided through the use of subtraction unit 1 and usage of upper order calibration bits.

For the foregoing reasons, the present invention provides an analog to digital conversion apparatus capable of high speed, high accuracy, and high resolution. In order that the ADC 4 have its input signal D lying within its acceptable input range, incrementation and decrementation of the up/down counter 7 is conducted in very small adjustment steps. This allows quick conversion of an analog signal representing a continuous natural phenomena. The analog to digital converted value according to this invention does not at any time have all of its bits being zero. These qualities facilitate usage of the invention in conjunction with CPUs in data processing.

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. Apparatus for converting an analog input signal applied thereto to a digital output signal, said apparatus comprising:

analog to digital conversion means, said conversion means being adapted to convert an analog signal applied thereto to a digital signal so long as the magnitude of said analog signal lies within an acceptable range for said analog to digital conversion means;

means for scaling the analog signal applied to said analog to digital conversion means, said scaling means being adapted when necessary to (1) perform at least one adjustment step with respect to said analog input signal applied to said apparatus and thereby generate an adjusted analog signal lying within said range, and to (2) apply said adjusted analog signal to said analog to digital conversion means;

means for calibrating said scaling means by determining the effect of the performance of said scaling means upon the digital signal produced by said analog to digital conversion means and for producing a digital signal in accordance therewith wherein said calibration means comprises:

means for determining the effect of the performance of a single adjustment step by said scaling means upon the digital signal produced by said analog to digital conversion means and for generating a digital signal in accordance therewith;

means for storing said digital signal generated by said determining means; and, means for multiplying said stored digital value by a digital value indicative of the number of adjustment steps required by said scaling means; and, means for performing at least one mathematical operation with respect to said digital signal produced by said calibrating means and said digital signal produced by said analog to digital conversion means, the result of said mathematical operation being the digital output signal of said apparatus.

2. The apparatus of claim 1, wherein said determining means comprises:

first register means for storing therein a first digital value corresponding to the digital signal produced by said analog to digital conversion means before said scaling means performs a single adjustment step;

second register means for storing therein a second digital value corresponding to the digital signal produced by said analog to digital conversion means after said scaling means performs said single adjustment step; and, subtraction means for taking the difference between said first digital value stored in said first register means and said second digital value stored in said second register means.

3. The apparatus of claim 1, wherein said scaling means comprises:

means for detecting when the analog signal applied to said analog to digital conversion means does not lie within said acceptable range;

up/down counter means adapted to contain therein a digital value;

means responsive to said detecting means for selectively incrementing or decrementing said up/down counter means to adjust said digital value contained therein; said digital value being indicative of a relative number of adjustment steps required by said scaling means;

digital to analog conversion means having an input terminal connected to said up/down counter means and adapted to convert a digital signal to an analog signal; and, subtraction means, said subtraction means having a first input terminal for receiving said analog input signal applied to said apparatus, a second input terminal connected to an output terminal of said digital to analog conversion means, and an output terminal connected both to said analog to digital conversion means and to said detecting means.

4. A method for converting an analog input signal to a digital output signal, said method comprising the steps of:

using an analog to digital conversion means to convert an analog signal to a digital signal, said conversion means being adapted to convert an analog signal applied thereto to a digital signal so long as said analog signal lies within an acceptable input range for said analog to digital conversion means;

scaling said analog signal applied to said analog to digital conversion means using scaling means, said scaling means being adapted when necessary to (1) perform at least one adjustment step with respect to said analog input signal applied to said apparatus and thereby generate an adjusted analog signal lying within said range, and (2) apply said adjusted analog signal to said analog to digital conversion means;

calibrating said scaling means by determining the effect of the performance of said scaling means upon the digital signal produced by said analog to digital conversion means and for producing a digital signal in accordance therewith said calibrating step including the steps of:

determining the effect of the performance of a single adjustment step by said scaling means upon the digital signal produced by said analog to digital conversion means and generating a digital signal in accordance therewith;

storing said digital signal generated by said determining means; and, multiplying said stored digital value by a digital value indicative of the relative number of adjustment steps required by said scaling means; and, performing at least one mathematical operation with respect to said digital signal produced by said calibrating means and said digital signal produced by said analog to digital conversion means, the result of said mathematical operation being the digital output signal of said apparatus.

5. The method of claim 4 wherein said determining step comprises:

storing in a first register means a first digital value corresponding to the digital signal produced by said analog to digital conversion means before said scaling means performs a single adjustment step;

storing in a second register means therein a second digital value corresponding to the digital signal produced by said analog to digital conversion means after said scaling means performs said single adjustment step; and, subtracting from said first digital value stored in said first register means said second digital value stored in said second register means.

6. The method of claim 4, wherein said scaling step comprises:

detecting when said analog signal applied to said analog to digital conversion means does not lie within said acceptable range;

selectively incrementing or decrementing in response to said detecting means said up/down counter means to adjust a digital value contained therein, said digital value being indicative of the relative number of adjustment steps required by said scaling means;

converting the digital value contained in said up/down counter to an analog signal using digital to analog conversion means, said digital to analog conversion means having an input terminal connected to said up/down counter means and adapted to convert a digital signal to an analog signal; and, subtracting from said analog input signal applied to said apparatus said signal generated by said digital to analog conversion means, and applying the resultant signal to said analog to digital conversion means and to said detecting means.

* * * * *